Figure 1:
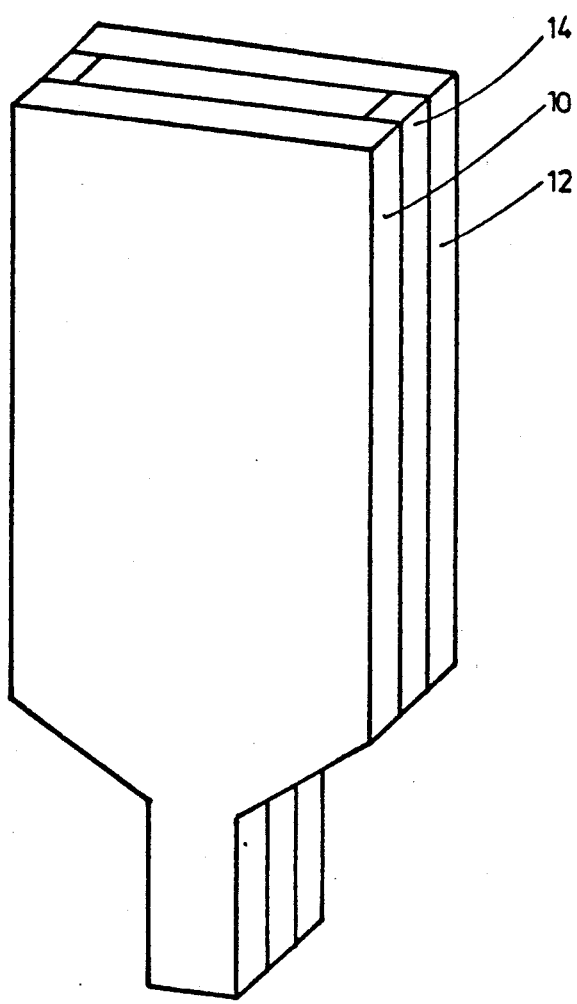

United States Patent [19]

Wisotzki

[11] Patent Number: 4,896,332
[45] Date of Patent: Jan. 23, 1990

[54] MONOCRYSTAL REFLECTORS FOR LASER APPLICATIONS

[76] Inventor: Jürgen Wisotzki, Weserstrasse 7a, 6074 Rödermark-Urberach, Fed. Rep. of Germany

[21] Appl. No.: 172,306

[22] Filed: Mar. 10, 1988

Related U.S. Application Data

[62] Division of Ser. No. 830,025, Jan. 11, 1985.

[30] Foreign Application Priority Data

Jan. 12, 1984 [DE] Fed. Rep. of Germany ....... 3400774

[51] Int. Cl.$^4$ ............................................. H01S 3/08
[52] U.S. Cl. ........................................ 372/99; 350/99; 75/72; 148/33; 102/307
[58] Field of Search ............... 148/33, 65, 174; 75/72; 269/2.7, 162; 372/99; 350/99; 102/307

[56] References Cited

U.S. PATENT DOCUMENTS

| | | | |
|---|---|---|---|
| 3,992,197 | 11/1976 | Wetzold | 75/118 R |
| 4,192,695 | 3/1980 | Mahalla | 148/32 |
| 4,312,667 | 1/1982 | Guertin | 75/72 |
| 4,551,287 | 11/1985 | Bethmann et al. | 102/307 X |
| 4,598,643 | 7/1986 | Skrocki et al. | 102/307 |

Primary Examiner—Peter A. Nelson
Attorney, Agent, or Firm—Larson and Taylor

[57] ABSTRACT

The invention relates to a process and an apparatus for the manufacture of monocrystal reflectors of copper, silver or gold for laser applications according to . . . patent application No. P 32 29 697.5-51 as well as reflectors manufactured according to this process.

2 Claims, 2 Drawing Sheets

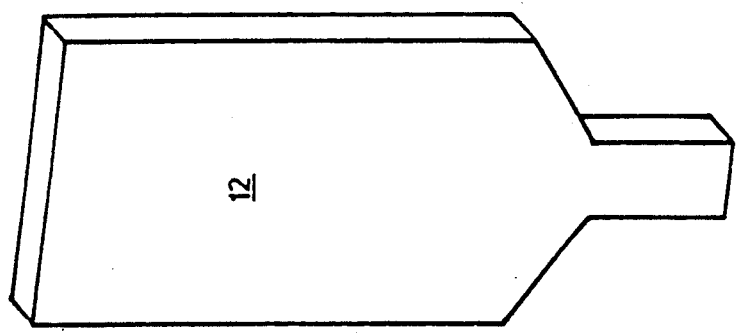
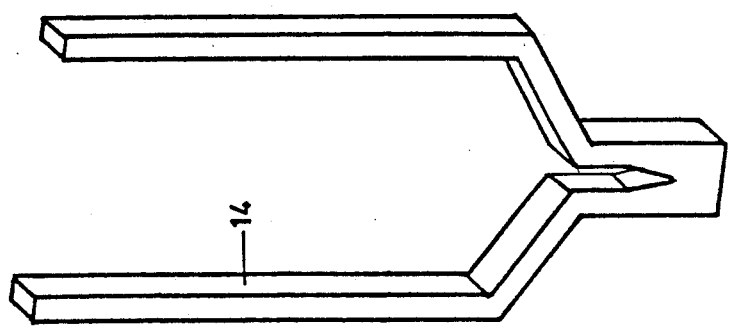
Fig. 2
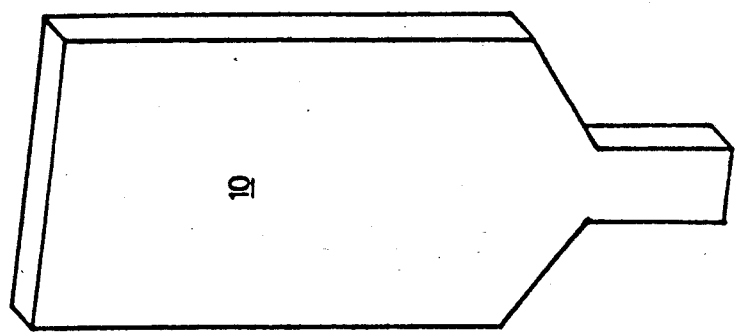

MONOCRYSTAL REFLECTORS FOR LASER APPLICATIONS

This is a division of application Ser. No. 830,025 filed Jan. 11, 1985

BACKGROUND OF THE INVENTION

In the reference patent application it is proposed to employ monocrystal reflectors in laser applications in lieu of metal reflectors of polycrystalline material. Contrary to expectations it was found that monocrystal reflectors withstand much better the extreme thermal loads caused by laser beams.

Further experiments meanwhile have shown that the advantages inherent in the monocrystalline structure of the reflecting metal body are partially lost again during forming and/or machining as these operations modify the homogeneous crystalline texture to varying degrees. The negative effects of traditional polishing treatment, by which reflectivity in reflectors of polycrystalline material is enhanced normally, was noted accidentally when it was found that reflexion produced by monocrystal reflectors was markedly better in the case of etched surfaces than in traditionally polished surfaces (cf. German patent application P 33 12 595.3). Etched surfaces, however, are inhomogeneous so that while of interest as protective shields against laser beams they do not lend themselves to optical or similar purposes in which a specific optical path requires a precisely defined reflecting surface.

In this situation the object of this invention is to provide a process by means of which monocrystal reflectors of optical quality may be produced without recourse to mechanical treatment as needed in polishing. The invention therefore proposes that the monocrystals are produced with a finished reflecting surface in a crucible polished to optical quality on the inside of its counter-surface.

The effect of the invention is based on the fact that when a monocrystal is grown in a crucible, e.g. by employing the Bridgeman-process, the monocrystal surfaces obtained upon melt solidification will represent accurate impressions of the crucible's forming surfaces. This is due to the fact that the solidification front of the growing crystal will tend to adhere to any unevenness and roughness on the crucible inside wall and, therefore, the crucible inside wall will become imprinted on the crystal surface. It is this quality that is utilized positively by this invention by proposing to polish the crucible wall to optical standard thus obviating the need for polishing the monocrystal grown in the crucible. Moreover, it is more economic to polish a forming crucible once rather than each workpiece individually.

In addition the invention offers the possibility of growing, virtually without extra cost, monocrystals incorporating opposite reflecting surfaces in a crucible having polished opposite inside surfaces. The outcome will be monocrystal reflectors having a reflecting surface at their front and rear. At practically invariant production cost these offer the advantage of allowing rotation when one face is damaged, thus having a service life twice as long.

The efficiency of the new process is particularly apparent when in the preferred embodiment at least on one lateral face mirror-like monocrystals are grown whose length is a multiple of the length of the reflector to be produced and when the monocrystal is then separated into several reflectors. Separating the monocrystal by cutting it into several smaller reflectors has no adverse effect upon the reflecting surfaces or the underlying crystal structure. The outstanding qualities of these reflecting monocrystals, reflectivity and optimal conductivity, given the absence of grain boundaries in the crystal lattice, are thus preserved. Similarly, irregular stresses in the material during cutting of the monocrystal can be avoided so that deformation as a result of heating under beam load need not be anticipated. The square or rectangular shape of reflectors, resulting from cutting a larger monocrystal, presents no practical drawback over the conventional round shape. It merely requires adaptation of the reflector mounting.

One characteristic feature of a monocrystal reflector according to this invention, regardless whether formed as a single piece or separated from a larger monocrystal, is its reflecting surface consisting of an unworked monocrystal structure. This natural surface, undamaged and without polishing marks, offers the greatest resistance to impinging laser rays as there are neither irregularities nor inhomogenities in the material and as no material is "smeared" over its surface, usually the case with polishing, which might evaporate under the effect of a laser beam, rendering the reflector blind so that it would reflect less and absorb more light, ultimately being overheated and destroyed.

Drawing of monocrystals in forming crucibles has been described previously in patent application P 33 23 991.6. This process makes it possible to obtain virtually any type of surface or shapes directly during the transition from the liquid to the solid state of the metal so that the finished product is obtained without any subsequent forming or machining, associated with irregular stresses in the material. This will apply, under this invention, even when the final product is intended to have one or several reflecting surfaces inasmuch as it will suffice to polish at least one inside surface of the crucible to optical standard. Vitreous graphite (glass graphite, glass coal), as obtainable from graphite suppliers for crucibles, was found to be best suited as crucible material. This material permits machining and polishing treatment. Depending on whether the polished inside crucible surfaces have plane or curved shape, any monocrystal grown in the crucible will be given a reflecting surface of corresponding shape.

The crucible is preferably made up of several component parts for ease of machining and polishing. These parts are then assembled to form the required crucible and are held together by bolts or clamps. An advantage of this crucible construction is that inside surfaces are easily accessible for machining.

The process of growing monocrystals in graphite crucibles, usually by the Bridgeman process uring protective gas, is sufficiently well known, therefore no description is included.

The enclosed drawing illustrates the construction of a crucible for making monocrystal reflectors according to this invention. FIG. 1 shows the crucible in its assembled form while FIG. 2 shows the component parts of the crucible in perspective.

The crucible illustrated consists of two flat side sections 10 and 12 and a fork-like middle section 14. These three crucible sections, assembled as in FIG. 1, are held together by clamps, not shown. The crucible cavity, enclosed by these sections, has a constant flat rectangular cross-section from the top downwards and tapers at the lower end, across oblique surfaces, into a narrow tip into which a germ crystal is placed at the beginning of the process and by means of which the orientation of the monocrystal to be grown is determined.

In the case illustrated here the inside surfaces of both crucible sections 10 and 12 are polished so that the monocrystals produced in the crucible will be given a surface quality identical to that of the polished surfaces. In this manner a monocrystal with reflecting surfaces on opposite sides is obtained.

The invention is not bound to any specific process for growing monocrystals. One skilled in the art has at his disposal a number of different processes. The important thing is that monocrystals are grown in a crucible having inside surfaces machined to exacting surface standards permitting reflecting surfaces of optical quality to be obtained.

At the present time such monocrystal reflectors embodying a homogeneous monocrystal structure at their extreme surface and hence optimal thermal conductivity are particularly useful for $CO_2$-lasers and other high-efficiency lasers.

I claim:

1. A reflector of copper, silver or gold used for laser applications, produced from a monocrystal using a crucible having at least one surface polished to optical quality which is in contact with a reflecting surface of the reflector during the production of the reflector, said reflecting surface being of optical quality and having an unworked monocrystal structure.

2. A reflector as claimed in claim 1 wherein said monocrystal has opposed reflecting surfaces produced using a crucible incorporating opposed polished inside surfaces.

* * * * *